(12) United States Patent
Zwolinski et al.

(10) Patent No.: US 6,224,666 B1
(45) Date of Patent: May 1, 2001

(54) FORGING CYLINDRICAL ALKALI HALIDE INGOTS INTO RECTANGULAR PLATES

(75) Inventors: Robert S. Zwolinski, Elmhurst; Lev G. Eidelman, Hoffman Estates, both of IL (US)

(73) Assignee: Siemens Medical Systems, Inc., Iselin, NJ (US)

( * ) Notice: Subject to any disclaimer, the term of this patent is extended or adjusted under 35 U.S.C. 154(b) by 0 days.

(21) Appl. No.: 09/334,148

(22) Filed: Jun. 15, 1999

(51) Int. Cl.[7] ................................................. C30B 15/36
(52) U.S. Cl. ........................ 117/3; 117/1; 117/2; 117/902
(58) Field of Search ................................. 117/1, 2, 3, 11, 117/902, 940

(56) References Cited

U.S. PATENT DOCUMENTS 5,792,253 * 8/1998 Eidelman et al. ..................... 117/2

* cited by examiner

*Primary Examiner*—Felisa Hiteshew
(74) *Attorney, Agent, or Firm*—Mark H. Jay

(57) ABSTRACT

A cylindrical alkali halide melt-grown single-crystal-type ingot is axially compressed in a heated dual-platen press while in a plastic state. The ingot is located mid-way between two parallel, planar, vertically extending barriers. By properly orienting the platens and the barriers with respect to the crystal lattice structure of the ingot, the ingot can be forged into a rectangular block that is not only devoid of peripheral cracks and fissures but that also has more uniform properties even when impurities and activator (Tl, in the case of NaI(Tl)) are not uniformly distributed within the initial single-crystal ingot.

10 Claims, 3 Drawing Sheets

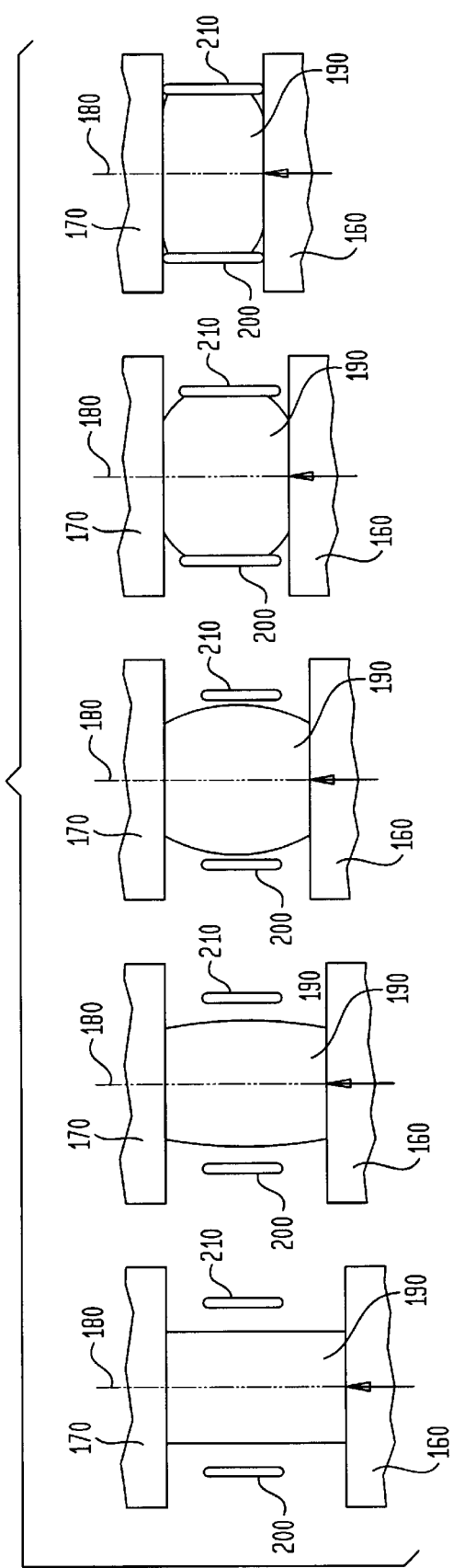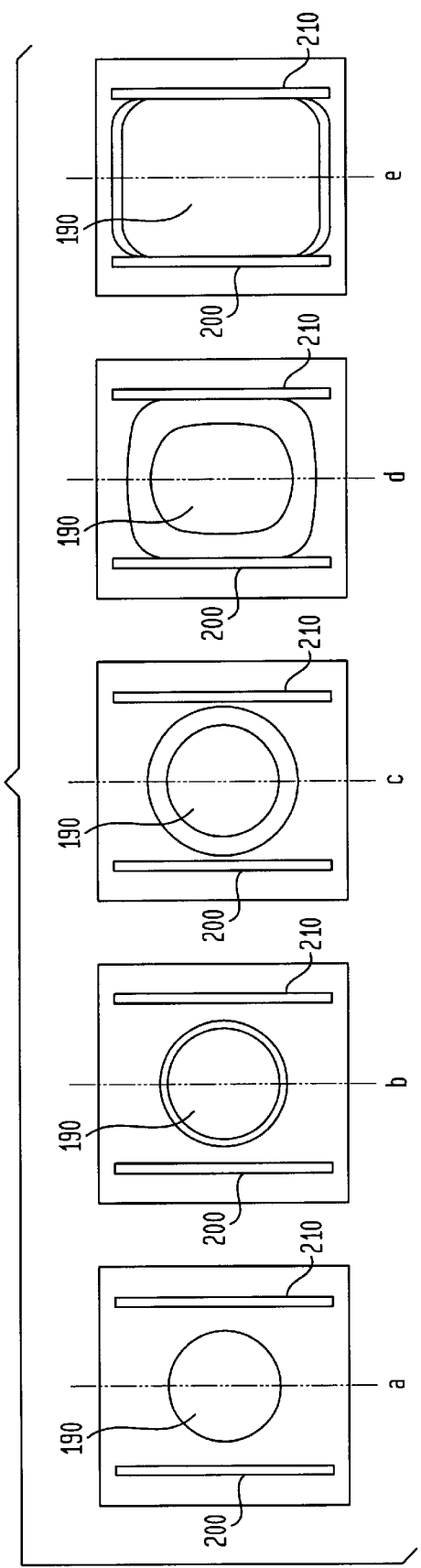

FORGING CYLINDRICAL ALKALI HALIDE INGOTS INTO RECTANGULAR PLATES

BACKGROUND OF THE INVENTION

The invention relates to alkali halide scintillation crystals, and more particularly relates to methods by which alkali halide scintillation crystals may be manufactured. In its most immediate sense, the invention relates to hot forging of NaI(Tl) scintillation crystals so as to produce rectangular scintillators having a large area, a rectangular shape, and uniform properties.

U.S. Pat. No. 5,792,253 (hereinafter, the "'253 patent") discloses a method of forging a cylindrical ingot of an alkali halide. In accordance with that method, a melt-grown ingot is flatted parallel both to its axis and to a particular crystallographic plane; the particular plane is determined by the crystal structure of the alkali halide to be forged. Then, the flat is placed on the lower platen of a heated dual-platen press and the ingot is compressed (advantageously, by raising the lower platen) between the platens while in a plastic state. The method produces a forged ingot in which cracks and fissures are absent from the periphery of the ingot.

Although this method achieves its intended objective, under certain circumstances the method can produce ingots having inhomogeneous characteristics (such as transparency and scintillation efficiency). For example, when NaI is doped with a Tl activator, the Tl content in the melt may be unstable during the growth process. The same is true for the content of impurities. As a result, the melt-grown ingot will be correspondingly inhomogeneous, and the inhomogeneity will be most pronounced along the growth direction of the ingot (i.e. along the axis of the ingot as it emerges from the melt). Hence, when the ingot is forged, the inhomogeneity of its composition can cause the characteristics of the forged ingot to progressively change from one region of the forged ingot to another. This adversely affects the performance of scintillation crystals made from the forged ingot.

In accordance with the invention, the melt-grown alkali halide ingot is still heated to plasticity and compressed between the heated platens of a dual-platen press, but before the compression begins the ingot is placed mid-way between two parallel, planar, and vertically extending barriers. The ingot is positioned so that its axis is vertical and so that the barriers are maintained in a predetermined relationship with the crystal lattice structure of the ingot. (If the ingot is of NaI, which has a face-centered crystal lattice, the barriers are parallel to the (100) crystallographic plane or to the (010) crystallographic plane. If the ingot is of CsI, which has a body-centered crystal lattice, the barriers are parallel to the (100) crystallographic plane.) Then, the ingot is compressed along its axis to form a block. (If the ingot is of NaI, this axis will generally coincide with the [001] crystallographic direction. If the ingot is of CsI, this axis will generally coincide with the [011] crystallographic direction.)

Because the ingot is compressed along the direction in which its inhomogeneities have the most pronounced effect on the characteristics of the ingot, the block is more uniform along its length and width. The block is therefore more likely to produce scintillation crystals suitable for use in scintillation cameras.

Advantageously, the barriers are connected together by transversely extending frame elements to form a rectangular frame. Advantageously, the distance between the barriers is less than the distance between the frame elements, which causes the block to have a generally rectangular shape. Further advantageously, the frame is suspended from the upper platen by cables that are counterbalanced by weights. This keeps the frame aligned with the thickest portion of the ingot as the forging process proceeds.

Alternatively, if the ingot is supported on the lower platen and its upper end is substantially narrower than its lower end (as is the case when the growth process comprises gradual broadening of the ingot in the first stage or gradual narrowing of the ingot in the final stage) the frame can be placed on the lower platen and can rest upon the lower platen as compression proceeds. Ideally, the ingot as pulled from the melt is a single crystal, i.e. has an unvarying crystallographic structure. However, this is not absolutely necessary. Ingots made up of more than one crystal can also be forged. Such forging can be done as long as it is possible, in an overall sense, to orient the crystallographic structure of the ingot with respect to the axis of compression, i.e. as long as all the crystals are not severely misaligned with respect to each other.

BRIEF DESCRIPTION OF THE DRAWINGS

The invention will be better understood with reference to the following illustrative and non-limiting drawings, in which:

FIGS. 5 and 6 schematically illustrate forging of an ingot in accordance with a preferred embodiment of the invention.

DETAILED DESCRIPTION OF PREFERRED EMBODIMENTS

The detailed description focuses upon forging NaI(Tl), because this material is a preferred scintillator for a scintillation camera. However, it is also possible to forge CsI, and a person skilled in the art can do so with reasonable experimentation based upon the information set forth below.

Figure 1:
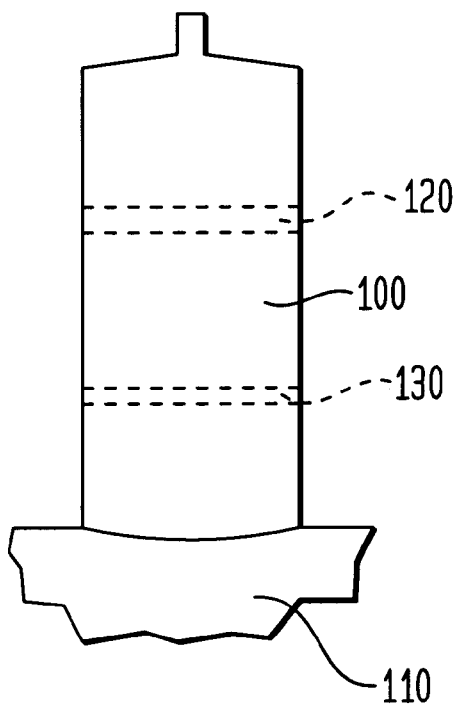
FIG. 1 schematically illustrates an inhomogeneous ingot being pulled from a melt.
Figure 2:
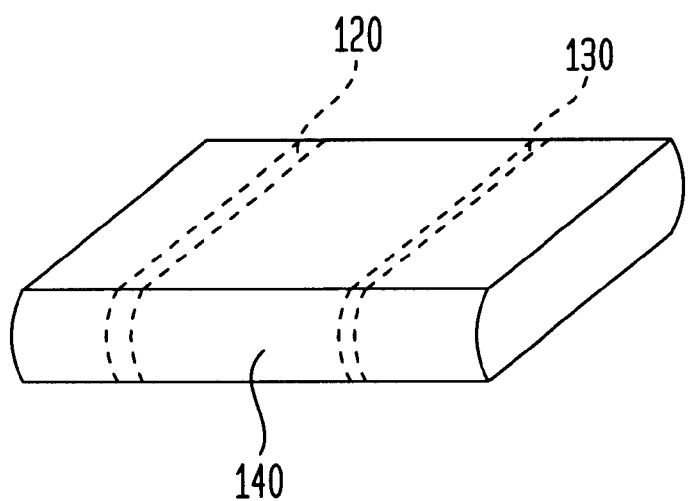
FIG. 2 schematically illustrates a forged block formed from the inhomogeneous ingot schematically illustrated in FIG. 1.

FIGS. 1 and 2 illustrate how the methodology disclosed in the '253 patent can produce a forged block having unacceptably inhomogeneous properties. Let it be assumed (see FIG. 1) that an ingot 100 is pulled from a melt 110 containing NaI and a relatively small doping of Tl activator, and that the Tl concentration in the melt 110 can vary during the growth process. Correspondingly, the concentration of Tl in the growing ingot 100 can vary between e.g. a local maximum in region 120 and a local minimum in region 130. (Regions 120 and 130 are merely illustrative; the local maximum could equally well be in region 130 or elsewhere and the local minimum could equally well be in region 120 or elsewhere).

When the ingot 100 is forged in accordance with the disclosure of the '253 patent, the region 120 might end up being located at one end of a forged block 140 and the region 130 might end up being located at the other end of the block 140 (see FIG. 2). In such a case, the scintillation efficiency of scintillation crystals cut from the block 140 would vary substantially with location. Such a variation would make the crystal plates, cut parallel with the axis of the initial ingot, unsuitable for use in a scintillation camera, and the forged block 140 would be unusable for that purpose.

This problem is not limited to inhomogeneous distribution of Tl activator. Impurities can also be inhomogeneously distributed within the grown ingot, and can produce inhomogeneities in other crystal characteristics, such as transparency.

For this reason, it would be advantageous to improve upon the methodology disclosed in the '253 patent.

The '253 patent discloses that a melt-grown single-crystal-type alkali halide ingot can be forged into a block. This can be done by heating the ingot to a temperature below its melting point and applying pressure normal to its axis, along a predetermined crystallographic direction, while the ingot is in a plastic state. The direction is selected to maximize shear stress in the system of easy slip. In accordance with the preferred embodiment of the present invention, the ingot 190 is still heated to a temperature below its melting point, but the pressure is applied along the axis 180 of the ingot 190 (see FIGS. 3 and 4). For an ingot 190 of a face-centered alkali halide such as NaI(Tl), the ingot 190 will be compressed while at a temperature of 450° C. to 500° C. and this axis 180 will substantially coincide with the [001] crystallographic direction. For an ingot 190 of a body-centered alkali halide such as CsI, the ingot 190 will be compressed while at a temperature of 420° C. to 470° C. and this axis 180 will substantially coincide with the [011] crystallographic direction.

In further accordance with the preferred embodiment, compression takes place while the ingot 190 is located mid-way between two parallel, planar, vertically extending barriers 200, 210 that are oriented to have a predetermined relationship with the crystallographic structure of the ingot 190. If the ingot 190 has a face-centered lattice (as does NaI), the barriers 200, 210 are arranged to be parallel to either the (100) crystallographic plane or the (010) crystallographic plane (these two planes are longitudinal {100} crystallographic planes of the ingot 190). If the ingot 190 has a body-centered lattice (as does CsI), the barriers 200, 210 are arranged to be parallel to the (100) longitudinal crystallographic plane. Advantageously, and in accordance with the preferred embodiment, the barriers 200, 210 are maintained in fixed relation by transversely extending frame elements 220, 230. The distance between the barriers 200, 210 is less than the distance between the frame elements 220, 230, so all the elements together form a rectangular frame generally indicated by reference numeral 240. The frame 240 has interior dimensions generally corresponding to those of the block into which the ingot 190 is to be forged and bounds an interior volume generally corresponding to that of the ingot 190.

Figure 3:
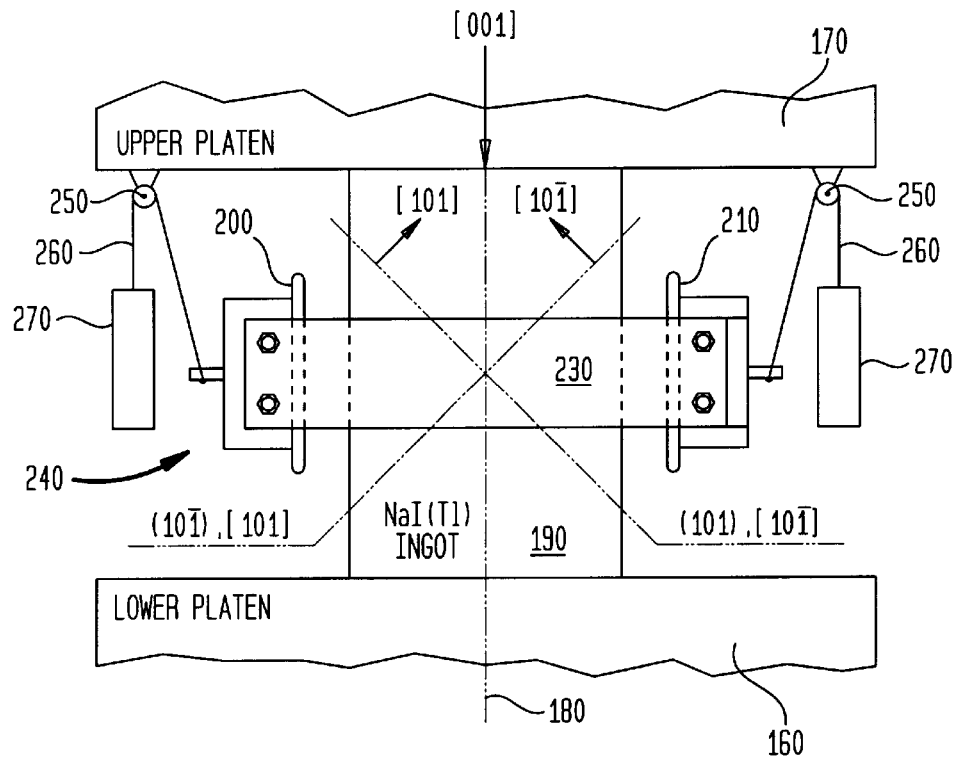
FIGS. 3 and 4 schematically illustrate apparatus used in accordance with a preferred embodiment of the invention.

As can be seen in FIG. 3, if the cylindrical single-crystal-type NaI(Tl) ingot 190 is placed in a dual platen press with the [001] ingot axis normal to the platens 160 and 170, both the slip directions [101], [10$\bar{1}$] and the normals to the planes (101), (10$\bar{1}$) of easy slip are inclined at angles 45 degrees to the compression axis [001]. The same is true for directions [011], [01$\bar{1}$] (not shown) and planes of easy slip (011), (01$\bar{1}$) (also not shown). Therefore, as is explained in the '253 patent, a compression of the ingot between the lower platen 160 and the upper platen 170 will cause a deformation in which only four of the six possible planes of the system of easy slip {011}<01> participate. In all other slip systems shear stresses will be significantly less so that such other slip systems will be inactive. Hence, as in the '253 patent, deformation of the ingot 190 occurs only along particular directions, thereby preventing the uncontrolled type of deformation that causes cracking and fissuring.

Figure 4:
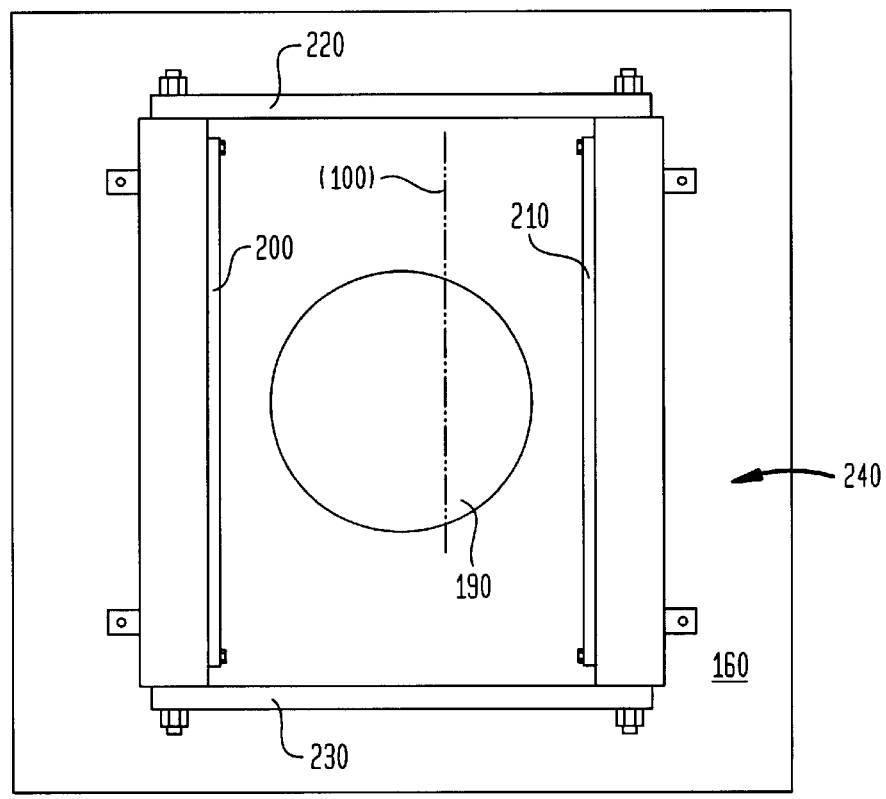

In accordance with the preferred embodiment, and as is illustrated in FIG. 4, for a NaI(Tl) ingot or other alkali halide with a face-centered crystal lattice, the barriers 200, 210 are parallel to one of the two longitudinal {100} crystallographic planes of the ingot, i.e. either to the (100) crystallographic plane (shown in FIG. 4) or to the (010) crystallographic plane. (If the ingot is of CsI or other alkali halide having a body-centered crystal lattice, the barriers 200, 210 would be oriented parallel to the (100) crystallographic plane.) As compression of the ingot 190 continues, the ingot 190 becomes progressively more barrel-shaped (see FIG. 5) and eventually touches the barriers 200, 210. From this point on, the barriers 200, 210 begin to block deformation along the orthogonal planes of easy slip (101), (10$\bar{1}$), while deformation along the other planes of easy slip (011'), (01$\bar{1}$) continues until compression of the ingot 190 comes to an end.

As can be seen in FIG. 3, in accordance with the preferred embodiment the frame 240 is suspended from the upper platen 170 by a counterweighted system that includes pulleys 250, cables 260, and counterweights 270. Each cable 260 passes through a pulley 250 and is attached at one end to the frame 240 and at the other end to a counterweight 270. This arrangement keeps the barriers 200, 210 approximately centered with respect to the center of the barrel-shaped ingot 190. As a result, the widest part of the ingot 190 does not become located above or below the barriers 200, 210 (and is therefore not cut off, see below) as compression continues. The height of the barriers 200, 210 determines the minimum distance between the lower platen 160 and the upper platen 170, i.e. the thickness of the ingot 190 in its finally forged state. Advantageously, the top and bottom edges of the barriers 200, 210 are rounded. This makes it possible to cut off any portions of the ingot 190 that get caught between one of the platens 160, 170 and one of the barriers 200, 210 during the forging process.

In accordance with the preferred embodiment, the dimensions of the frame 240 are chosen so that the frame 240 is slightly longer than the final length of the block into which the ingot 190 is forged and bounds an interior volume that is slightly larger than the volume of the ingot 190. The preferred embodiment is designed to facilitate production of rectangular NaI(Tl) gamma camera scintillation crystals that are each 590.6 mm long by 444.5 mm wide by 9.5 mm thick. To that end, a melt-grown cylindrical NaI(Tl) ingot 190 that is 430 mm in diameter and 550 mm long is forged into a block that is about 660 mm long (between the frame elements 220 and 230) 520 mm wide (between the barriers 200 and 210) and 230 mm thick (the height of the barriers 200 and 210). The forged block can then be subdivided (as by sawing, not shown) into fifteen to eighteen plates (not shown), each having the intended dimensions.

As is disclosed in the '253 patent, heat-resistant fiberglass cloth impregnated with powdery boron nitride may advantageously be used to prevent the ingot 190 from touching any of the metal surfaces and to prevent the cloth from sticking to the ingot 190. This cloth is used to cover the lower and upper platens 160 and 170 and the barriers 200 and 210.

As is likewise disclosed in the '253 patent, it is advantageous to heat and cool the ingot 190 slowly. For a NaI(Tl) ingot 190 of about 400 mm in diameter and 600 mm in length, it is presently preferred to heat the ingot 190 to 500° C. over four days, to compress it by raising the lower platen 160 towards the upper platen 170 over seven hours using a pressure of up to 120 tons, to cool the forged block to 60° C. over four days after compression has been completed, and to self-cool the forged block to room temperature over another three days.

An alternative embodiment is preferred when the ingot 190 is substantially narrower at one end. In this instance, the ingot 190 will become barrel-shaped not at its center but closer to its wider end during the compression process. When the ingot 190 has this inhomogeneous shape, the wider end is placed on the lower platen 160, the narrower end is compressed by the upper platen 170, and the frame 240 rests upon the lower platen 160 while the ingot 190 is being compressed.

Although a preferred embodiment has been described above, the scope of the invention is limited only by the following claims:

1. A method of forging a generally cylindrical alkali halide single-crystal-type ingot of a crystal material having a crystallographic structure of the face-centered lattice type, the ingot having an axis generally coinciding with the [001] crystallographic direction, comprising the following steps:

placing the ingot between two parallel, planar, vertically extending barriers and orienting the ingot so that its axis is vertical, so that the ingot is mid-way between the barriers, and so that a one of the (100) and (010) crystallographic planes is parallel to the barriers;

heating the ingot to a temperature below the melting point of the alkali halide;

compressing the ingot along its axis; and maintaining the barriers in fixed relation to each other.

2. The method of claim 1, wherein the alkali halide is sodium iodide and the temperature is between 450° C. and 500° C.

3. A method of forging a generally cylindrical alkali halide single-crystal-type ingot of a crystal material having a crystallographic structure of the body-centered lattice type, the ingot having an axis generally coinciding with the [011] crystallographic direction, comprising the following steps:

placing the ingot between two parallel, planar, vertically extending barriers and orienting the ingot so that its axis is vertical, so that the ingot is mid-way between the barriers, and so that the (100) crystallographic plane is parallel to the barriers;

heating the ingot to a temperature below the melting point of the alkali halide;

compressing the ingot along its axis; and maintaining the barriers in fixed relation to each other.

4. A method of claim 1 or claim 3, wherein said placing step comprises the step of supporting the ingot upon the lower platen of a press having parallel upper and lower platens, and wherein said barriers are suspended between said lower platen and said upper platen, and further comprising the steps of:

heating the ingot to said temperature;

moving at least one of the upper and lower platens toward the other platen and compressing the ingot therebetween; and cooling the ingot to room temperature.

5. The method of claim 4, wherein the barriers are maintained in fixed relation by transversely extending frame elements to form a rectangular frame having interior dimensions generally corresponding to those to which the ingot is to be forged and having an interior volume generally corresponding to that of the ingot.

6. The method of claim 5, wherein the rectangular frame is suspended from the upper platen by a counterweighted mechanism, the mechanism comprising a plurality of pulleys mounted to the upper platen and a like plurality of cables, each cable passing through a corresponding one of the pulleys, being secured to the frame at one of its ends, and being secured to a counterweight at the other of its ends.

7. The method of claim 4, wherein the ingot is compressed from an initial diameter of approximately 430 mm and 550 mm in length to a generally rectangular shape having a final thickness of approximately 230 mm.

8. The method of claim 1 or claim 3, wherein the upper end of the ingot is substantially narrower than the lower end of the ingot.

9. A method of claim 1 or claim 3, wherein said placing step comprises the step of supporting the ingot upon the lower platen of a press having parallel upper and lower platens, and wherein said barriers rest upon said lower platen, and further comprising the steps of:

heating the ingot to said temperature;

moving at least one of the upper and lower platens toward the other platen and compressing the ingot therebetween; and cooling the ingot to room temperature.

10. The method of claim 3, wherein alkali halide is cesium iodide and the temperature is between 420° C. and 470° C.

* * * * *